US005854558A

United States Patent [19]

Motooka et al.

[11] Patent Number: 5,854,558

[45] Date of Patent: Dec. 29, 1998

[54] TEST BOARD FOR TESTING A SEMICONDUCTOR DEVICE AND METHOD OF TESTING THE SEMICONDUCTOR DEVICE

[75] Inventors: Toshiyuki Motooka; Syuichirou Takahashi; Tatsuharu Matsuda; Kunio Kodama; Jouji Fujimori, all of Kawasaki, Japan

[73] Assignee: Fujitsu Limited, Kanagawa, Japan

[21] Appl. No.: 531,449

[22] Filed: Sep. 21, 1995

[30] Foreign Application Priority Data

Nov. 18, 1994 [JP] Japan .................................... 6-285342

[51] Int. Cl.[6] ...................................................... G01R 31/02

[52] U.S. Cl. ............................................ 324/754; 324/761

[58] Field of Search .................................... 324/754, 72.5, 324/73.4, 761

[56] References Cited

U.S. PATENT DOCUMENTS

| | | | |
|---|---|---|---|
| 4,801,871 | 1/1989 | Tada et al. | 324/73.1 |
| 5,055,778 | 10/1991 | Okubo et al. | 324/754 |
| 5,060,843 | 10/1991 | Yasuzato et al. | 228/179 |
| 5,172,851 | 12/1992 | Matsushita et al. | 228/179 |
| 5,326,428 | 7/1994 | Farnworth et al. | 156/654 |
| 5,420,520 | 5/1995 | Anschel et al. | 324/754 |
| 5,483,741 | 1/1996 | Akram et al. | 29/846 |
| 5,500,605 | 3/1996 | Chang | 324/758 |
| 5,521,519 | 5/1996 | Faure et al. | 324/754 |

OTHER PUBLICATIONS

Yuichi Nakamura, "Bare–chip burn–in test system," Electronics Fabricating technology in Japanese, vol.11 No.4, pp.27–31, 1995 (Month Unavailable).

Randal Reebuck, et al., "Performance Testing of a Non–Destructive Burn–In Interconnect system for Known Good Die, DieMate," Texas Instruments Technical Library, 1994 (Month Unavailable).

Moto'o Nakano, "A Probe for Testing Semiconductor Integrated Circuits and a Test Method Using Said Probe," 25 Mar. 1991, Japanese Patent Office Disclosure No. Hei 3–69131, Filing No. Hei 1–205301, Filing date Aug. 8, 1989.

*Primary Examiner*—Josie Ballato
*Assistant Examiner*—Russell M. Kobert
*Attorney, Agent, or Firm*—Armstrong, Westerman, Hattori, McLeland & Naughton

[57] ABSTRACT

A test board used for testing a semiconductor device provided with projection electrodes includes a main board and testing electrodes. The testing electrodes are provided on the main board, each projecting upwardly from the main board. When the semiconductor device is tested, the testing electrodes are electrically connected to the projection electrodes by insertion of the testing electrodes into the projection electrodes. The semiconductor device is mounted on the main board to test the semiconductor device through the testing electrodes.

10 Claims, 7 Drawing Sheets

26
22 SEMICONDUCTOR DEVICE
27
27 PROJECTION ELECTRODES
24
24
24 WIRE BUMPS
23 MAIN BOARD
20 TEST BOARD
21 BURN-IN TEST BOARD
25
25

TEST BOARD FOR TESTING A SEMICONDUCTOR DEVICE AND METHOD OF TESTING THE SEMICONDUCTOR DEVICE

BACKGROUND OF THE INVENTION

1. Field of the Invention

The present invention generally relates to a test board for testing a semiconductor device and a method of testing the semiconductor device, and more particularly, to a test board for testing a semiconductor device and a method of testing the semiconductor device which are suitably used for a test of a semiconductor device having projection electrodes.

Recently, in semiconductor devices, high-density integration, high-speed operation, and miniaturization is required. To meet the requirements, a method of directly mounting a plurality of bare chips (semiconductor chip which is not sealed within a package) on a circuit board is being widely used. For example, by the method, a multichip module is constructed.

In the method of mounting the plurality of bare chips, if a problem occurs in one of the plurality of bare chips mounted in the multichip module, the whole multichip module is rejected. Therefore, for each bare chip, a high level of reliability is required.

Accordingly, it is important to examine whether or not each bare chip operates properly.

2. Description of the Related Art

A variety of methods of testing a semiconductor device having projection electrodes are currently proposed and used. Herein, the bare chip and the semiconductor device sealed by plastic are wholly referred to as the semiconductor device. In the following, typical methods will be described.

A first conventional method is a testing method using a probe (which is referred to as a probe testing method, hereinafter). In the probe testing method, a plurality of probes are arranged on a test board according to the projection electrodes formed on the semiconductor device, and a test is carried out by directly contacting a top end of the probe with the projection electrode.

A second conventional method will be discussed by referring to FIG. 1. FIG. 1 shows an illustration for explaining the second conventional testing method for the semiconductor device. In the testing method shown in FIG. 1, projection electrodes 2 (which are referred to as solder bumps, hereinafter) formed on a semiconductor device 1 are soldered to testing electrodes 4 formed on a test board 3. In this way, the solder bumps 2 and the testing electrodes 4 are electrically connected to each other, and the semiconductor device 1 is tested. This testing method is referred to as a mount testing method, hereinafter. In this manner, as in a configuration where the semiconductor device 1 is mounted on the test board 3, the test is conducted.

A third conventional method will be discussed by referring to FIG. 2. FIG. 2 shows an illustration for explaining the third conventional testing method of the semiconductor device. In the testing method shown in FIG. 2, the semiconductor device 1 is pressed to the testing electrodes 4 formed on the test board 3 by using a fixed jig 5. By the pressure, the solder bumps 2 and the testing electrodes 4 are electrically connected, and the semiconductor device is tested.

This testing method is referred to as a press testing method, hereinafter. In the press testing method, the solder bumps 2 are not melted, instead, the solder bumps 2 and the testing electrodes 4 are electrically connected by mechanical pressure with the fixed jig 5.

The fixed jig 5 is constructed with a pressing plate 6 in contact with the semiconductor device 1, a bolt 7 penetrating through both the pressing plate 6 and the test board 3, and a nut 8 located on a rear side of the test board 3, etc. By screwing the bolt 7 to the nut 8, the semiconductor device 1 with the pressing plate 6 is pressed to the test board 3.

A fourth conventional method will be discussed by referring to FIG. 3. FIG. 3 shows an illustration for explaining the fourth conventional testing method of the semiconductor device. In the testing method shown in FIG. 3, conductive resin 9 is arranged on the testing electrodes 4 formed on the test board 3, and with the conductive resin 9, the solder bumps 2 and the testing electrodes 4 are electrically connected to test the semiconductor device. This testing method is referred to as a conductive-resin testing method, hereinafter. The conductive resin 9 may be made of, for example, elastic resin in which conductive metal powder is included. The conductive resin 9 has a conductivity in only a pressing direction.

Further, a fifth conventional method will be discussed by referring to FIG. 4. FIG. 4 shows an illustration for explaining the fifth conventional testing method of the semiconductor device. The testing method shown in FIG. 4 is applied to the semiconductor device 1 having gold bumps 10. In the method, insulating resin 11 having thermal contractibility is injected into gaps between the semiconductor device 1 and the test board 3. This testing method is referred to as a thermal contraction testing method, hereinafter. In the thermal contraction testing method, the insulating resin 11 is injected into the gaps between the semiconductor device 1 and the test board 3, and the insulating resin 11 is contracted by heat. By the contraction, the semiconductor device 1 and the test board 3 are close to each other. At this time, the gold bumps 10 are sandwiched between the semiconductor device 1 and the test board 3, and, thus, the gold bumps 10 are pressed and electrically connected to the testing electrodes 4.

Next, disadvantages in the above-mentioned conventional testing methods will be described.

In the probe testing method, when the pitch arrangement of the solder bumps becomes narrow as semiconductor elements are integrated with high density, the probe needs to be thinner. Also, for positioning the respective probes, a high level of accuracy is required. However, there are limitations on thinning the probe and for obtaining highly accurate positioning of the probes. Therefore, the probe testing method is not suitable for testing of the highly integrated semiconductor elements.

In the mount testing method, since the solder bumps 2 are soldered to the testing electrodes 4 formed on the test board 3, the solder bumps 2 need to be disconnected from the testing electrodes 4 when the test is finished. Therefore, in this method, both a heating process and melting process are carried out for soldering and disconnecting the solder bumps 2, and, thus, the solder bumps 2 may be damaged. Further, when the solder bumps 2 are disconnected form the testing electrodes 4, impurities may be mixed with the solder bumps 2, and a portion of the solder bump 2 may remain in the testing electrode 4. Therefore, the reliability of the solder bumps 2 may be degraded.

In the press testing method, since extremely high pressure is required for electrically connecting the respective solder bumps 2 and the respective testing electrodes 4 to each other, there is a problem that the solder bumps 2 and the testing electrodes 4 may be bent or broken by the high pressure. Further, when the highly-integrated semiconductor device 1 has a large number of solder bumps 2, an increased pressure is required for pressing the whole semiconductor device 1 to the test board 3. There is, thus, a problem that the fixed jig 5 becomes larger in size.

In the conductive-resin testing method, when the semiconductor device 1 is separated from the test board 3 after the test is finished, the conductive resin 9 may remain in the solder bumps 2. If the conductive resin 9 remains in the solder bumps 2, the conductive resin 9 may be mixed into the solder when the solder bumps 2 are melted to fabricate the semiconductor device 1. There is thus a problem that reliability of the solder bumps 2 may be degraded. Further, since a resistance of the conductive resin 9 becomes relatively high when the conductive resin 9 is connected, there is a problem in that accuracy of the test may be degraded.

Further, in the thermal contraction testing method, when the semiconductor device 1 is separated from the test board 3 after the test is finished, the insulating resin 11 may remain in the semiconductor device 1. Therefore, reliability of the gold bumps 10 may be degraded. Further, since the insulating resin 11 is arranged over all places between the semiconductor device 1 and the test board 3, it is not easy to separate the semiconductor device 1 from the test board 3. There is, thus, a problem in that operation efficiency may be degraded.

As mentioned above, in the conventional testing methods, there are problems in that reliability of the bumps and test efficiency may be degraded.

SUMMARY OF THE INVENTION

It is an object of the present invention to provide a test board for testing a semiconductor device and a method of testing the semiconductor device which improves reliability of projection electrodes and test efficiency, in which the disadvantages described above are eliminated.

The object described above is achieved by a test board for testing a semiconductor device provided with projection electrodes, the test board comprising: a main board; and testing electrodes provided on the main board, each projecting upward from the main board; wherein the testing electrodes are electrically connected to the projection electrodes by insertion of the the testing electrodes into the projection electrodes and the semiconductor device is mounted on the main board to test the semiconductor device through the testing electrodes.

According to the above test board, the testing electrodes are thrust into the projection electrodes. Therefore, it is ensured that the testing electrodes are electrically connected to the projection electrodes. Without an external mechanical pressure, the semiconductor device may be positively mounted to the main board. Therefore, it prevents the testing electrodes and the projection electrodes from being changed in shape and damaged. Further, when an oxide film is formed on a surface of the projection electrode, the testing electrode penetrates through the oxide film to be connected to the projection electrode. Therefore, a positive electrical connection between the testing electrodes and the projection electrodes is provided.

Further, when the testing electrodes are thrust into the projection electrodes, it is not necessary to apply heat. Therefore, under a normal temperature, a positive electrical connection between the testing electrodes and the projection electrodes is provided. Accordingly, it prevents the projection electrodes from being damaged by heat.

Furthermore, when the testing electrodes and the projection electrodes are electrically connected to each other, it becomes unnecessary to provide other conductive material between the testing electrodes and the projection electrodes, or between the semiconductor device and the main board. Therefore, reliability of the projection electrodes may be improved.

The object described above is also achieved by the test board mentioned above, wherein the testing electrodes are formed of a material comprising a base material and an additive, the material of the testing electrodes fails to produce a metallic compound upon reaction with the projection electrodes.

The object described above is also achieved by the test board mentioned above, wherein the base material comprises one of gold (Au) and palladium (Pd).

According to the above test board, an additive is added to the base material of the testing electrode. Therefore, the material of the testing electrodes will not produce a metallic compound including an alloy by reacting with the projection electrodes even under a usage temperature of a burn-in process. Accordingly, it prevents the projection electrodes from being damaged.

The object described above is also achieved by the test board mentioned above, wherein each of the testing electrodes comprises a covering film covering the testing electrodes, and the covering film is a material which fails to produce a metallic compound upon reaction with the projection electrodes.

The object described above is also achieved by the test board mentioned above, wherein the material of the covering film comprises nickel (Ni).

According to the above test board, the testing electrode is covered by the covering film which is made of the material which does not produce the metallic compound including an alloy as it does not react with the projection electrodes. The covering film prevents the material of the testing electrodes from being mixed into the projection electrodes. Therefore, the degradation of the projection electrodes may be prevented.

The object described above is also achieved by the test board mentioned above, wherein the testing electrodes comprise at least one wire bump.

According to the above test board, the testing electrodes are constructed with the wire bumps. The wire bumps can be formed by a conventional wire bonding apparatus used in a semiconductor-device manufacturing process. In this case, a height of the wire bump can be flexibly adjusted. Therefore, the testing electrodes may be formed with high efficiency and low cost.

The object described above is also achieved by the test board mentioned above, wherein the testing electrodes have different heights from a surface of the main board.

According to the test board, for the testing electrodes corresponding to the projection electrodes which do not need to be tested, the heights of the testing electrodes are adjusted lower so as to not be electrically connected to the projection electrodes. For the testing electrodes corresponding to the projection electrodes which need to be tested, the height of the testing electrodes is adjusted higher so as to be electrically connected to the projection electrodes. Namely, the projection electrodes to be tested may be selectively tested. Therefore, specified projection electrodes which do not need to be tested are prevented from being unnecessarily changed in shape by the testing electrodes being inserted.

The object described above is also achieved by the test board mentioned above, wherein the testing electrodes are harder than the projection electrodes.

According to the above test board, this prevents the testing electrodes from being changed in shape. Therefore, the test board may be used repeatedly. It is unnecessary to adjust the testing electrodes of the test board for each test.

The object described above is also achieved by the test board mentioned above, wherein each of the testing electrodes comprises a pedestal part having a predetermined bottom area, and a projection part extending upwardly from the pedestal part and having a cross-sectional area less than the bottom area of the pedestal part.

According to the above test board, since the pedestal part having a relatively wide bottom area is connected to the main board, the testing electrodes may be positively fixed to the main board. Since the projection part having the cross-sectional area narrower than the bottom area of the pedestal part is inserted into the projection electrode, this ensures that the projection part is easily inserted into the projection electrode.

The object described above is also achieved by a method of testing a semiconductor device on which projection electrodes are formed, the method using a test board having a main board and testing electrodes formed on the main board, each projecting upwardly from the main board, the method comprising the steps of: (a) mounting the semiconductor device on the main board of the test board by inserting the testing electrodes into the projection electrodes, wherein the testing electrodes are electrically connected to the projection electrodes; (b) testing the semiconductor device by using the testing electrodes connected to the projection electrodes; and (c) separating the semiconductor device from the test board.

According to the above method, by using the above-mentioned test board, under normal temperature, the semiconductor device is mounted on the main board of the test board so that the testing electrodes are electrically connected to the projection electrodes. After the test is finished, under normal temperature condition, the semiconductor device may be easily separated from the test board.

Therefore, in the step (a) of mounting the semiconductor device on the test board, no impurities are mixed into the projection electrodes. Accordingly, in the following step (b) of testing, a highly accurate test may be performed. Further, since the heating process is not necessary, the testing apparatus may be simplified.

In the step (c) of separating, since the semiconductor device is mounted on the test board by only inserting the testing electrodes into the projection electrodes, the semiconductor device may be separated from the test board by only pulling the semiconductor device from the test board. In this case, the heating process is not necessary and degradation of the projection electrodes may be prevented.

The object described above is also achieved by the method mentioned above, wherein the method further comprises a wet-back process of shaping the projection electrodes subsequent to the step (c).

According to the above method, since the wet-back process of shaping the projection electrodes formed on the semiconductor device is carried out after the step (c) is finished, the projection electrodes may be properly shaped.

When the projection electrode are formed by a plating method, voids may be generated within the projection electrode when solder is plated. The projection electrode in which the void is generated has a changed shape as compared to a normal projection electrode in which no void is generated. Therefore, to remove the void and to re-shape the projection electrode, the wet-back process is carried out. At this time, if the wet-back process is merely carried out without the semiconductor-device mounting process (specifically, the process of inserting the wire bumps into the projection electrodes), the void may not be perfectly removed.

However, by the testing electrodes being inserted into the projection electrodes in the step (a) of mounting, a concave part according to the shape of the testing electrode is formed in the projection electrode. At this time, the void and the concave part generated in the projection electrode are connected to each other. Under this condition, the wet-back process is carried out. Therefore, the voids may be completely removed. Accordingly, by the wet-back process being carried out after the separating process is finished, namely, after the concave part is formed in the projection electrode, the voids may be completely eliminated and the projection electrodes may be properly shaped.

Other objects and further features of the present invention will be apparent from the following detailed description when read in conjunction with the accompanying drawings.

DESCRIPTION OF THE PREFERRED EMBODIMENTS

Figure 5:
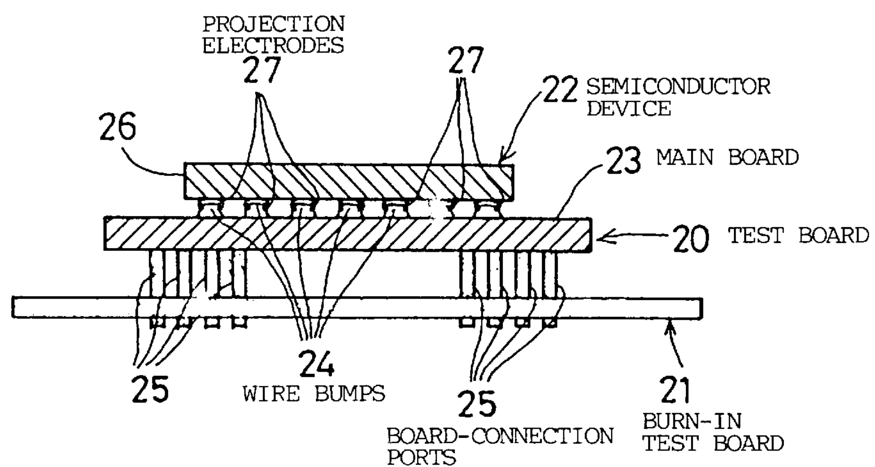
FIG. 5 shows an illustration for explaining a first embodiment of the test board of a semiconductor device and the method of testing the semiconductor device according to the present invention.

First, a description will be given of a first embodiment of a test board of a semiconductor device and a method of testing the semiconductor device according to the present invention, by referring to FIG. 5. FIG. 5 shows an illustration for explaining the first embodiment of the test board of the semiconductor device and the method of testing the semiconductor device according to the present invention. In FIG. 5, a test board 20 which is currently used for a test process is shown. In the test process, the test board 20 is installed in a burn-in in test board 21. On the test board 20, a semiconductor device 22 to be tested is installed.

In the following description, a bare-chip-type semiconductor element to be tested is shown. However, a plastic-sealed semiconductor device having projection electrodes, for example, a semiconductor device having a ball-grid-array (BGA) structure, may be applied to the test. Therefore, in the specification, if the bare-chip-type semiconductor device and the plastic-sealed semiconductor device have the projection electrodes, these semiconductor devices are wholly referred to as the semiconductor device 22.

Figure 6:
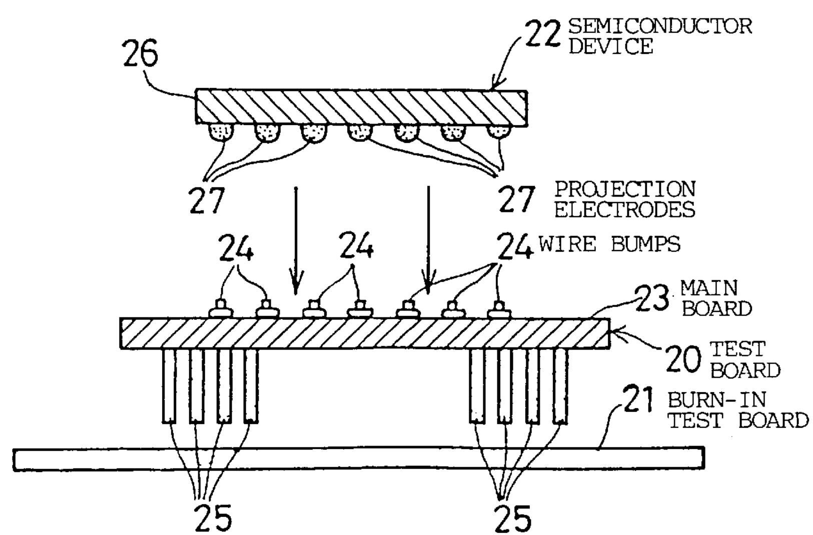
FIG. 6 shows an illustration in which the test board, the burn-in test board, and the semiconductor device shown in FIG. 5 are separated.

In the following, a detail configuration of the test board 20 will be described, by referring to FIG. 5 and FIG. 6. FIG. 6 shows an illustration in which the test board 20, the burn-in test board 21, and the semiconductor device 22 shown in FIG. 5 are separated from each other.

The test board 20 is constructed with at least a main board 23, testing electrodes 24, board connection ports 25. The main board 23 is, for example, a multilayer print board, and on the main board 23, a large number of testing electrodes 24 are formed. Each of the testing electrodes 24 has a wire bump structure, which is made of, for example, gold (Au). Therefore, the testing electrodes 24 (which are referred to as the wire bumps, hereinafter) are constructed such that gold wires are standing vertically on the main board 23.

The wire bumps 24 are formed in an interconnection pattern (not shown) on the main board 23. Since a conventional wire bonding apparatus used in a semiconductor manufacturing process is used for forming the wire bumps 24, the wire bumps 24 may be formed easily and efficiently.

In the wire bonding apparatus, a position of cutting the gold wire can be easily changed. Therefore, a height of the wire bump 24 from a surface of the main board 23 is also easily set by controlling the wire bonding apparatus. Also, the height of the wire bump 24 may be changed at each wire bump 24.

Figure 7:
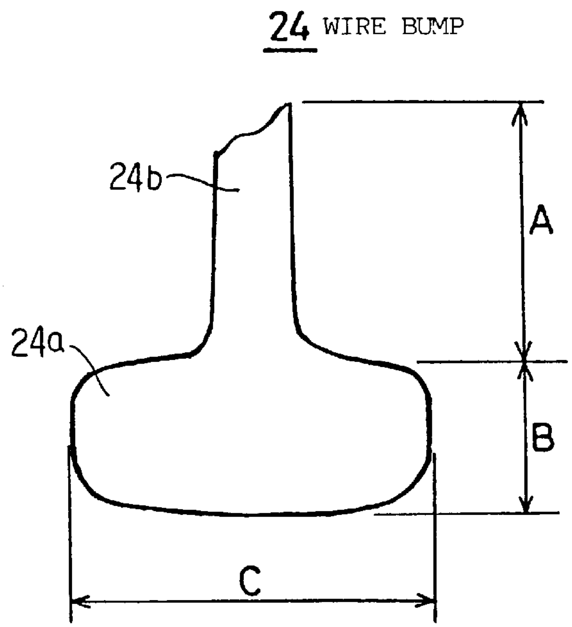
FIG. 7 shows a configuration of a wire bump shown in FIG. 5.

FIG. 7 shows a configuration of the wire bump 24 shown in FIG. 5. In FIG. 7, the wire bump 24 comprises a pedestal part 24*a* having a given bottom area and a projection part 24*b* extending upward from the pedestal part 24*a*. A cross-sectional area of the projection part 24*b* is less than the bottom area of the pedestal part 24*a*, and is formed so that the projection part 24*b* can be easily inserted into a projection electrode arranged on the semiconductor device (which will be described in further detail later). In FIG. 7, a length represented by an arrow A is approximately 40 μm, a length represented by an arrow B is approximately 30 μm, and a length represented by an arrow C is approximately 100 μm.

The board connection ports 25 are pin-type electrodes which are arranged to extend downwardly from a bottom face of the main board 23. An upper end part of each board connection port 25 is connected to the main board 23 to be supported. The upper end part of the board connection port 25 is electrically connected with the wire bump 24 through the inter connection or a surface connection. Therefore, the wire bumps 24 and the board connection ports 25 are electrically connected through the above connections.

On the other hand, a lower end part of each board connection port 25 is connected to the burn-in test board 21. The burn-in test board 21 is connected to a burn-in test apparatus (not shown). The burn-in test apparatus supplies a given signal to the semiconductor device 22 to be tested through the burn-in test board 21 and the test board 20. A signal generated in the semiconductor device 22 is received in the burn-in test apparatus through the test board 20 and the burn-in test board 21. In this way, the burn-in test apparatus examines whether the semiconductor device 22 is a good article or an article to be rejected.

In the above method, a plurality of test boards 20 may be arranged on the burn-in test board 21, and a plurality of semiconductor devices 22 are simultaneously tested.

The semiconductor device 22 mounted on the test board 20 is, for example, a semiconductor device used for a multichip module (MCM). In this case, a plurality of projection electrodes (bumps) 27 are formed on a bottom face (which is facing to the top surface of the main board 23) of the bare-chip-type element body 26. The projection electrode 27 is made of solder which is an alloy of lead (Pb) and tin (Sn). The solder (Pb/Sn) is softer than gold (Au). Therefore, mechanical strength (hardness) of the wire bump 24 made of gold (Au) is stronger than that of the projection electrode 27 made of solder.

Next, a description will be given of a method of testing the semiconductor device 22 by using the above-mentioned test board 20.

In the test of the semiconductor device 22, first, as a semiconductor-device mounting process, the semiconductor device 22 is mounted on the test board 20. Before the semiconductor-device mounting process, the test board 20 is previously installed in the burn-in test board 21.

Arranged positions of the wire bumps 24 formed on the test board 20 are associated with arranged positions of the projection electrodes 27 formed on the semiconductor device 22. Therefore, after the positioning of the wire bumps 24 and the projection electrodes 27 is carried out, the semiconductor device 22 is pressed to the test board 20. The above process is performed under normal temperature (in which the projection electrode 27 made of solder is not melted).

As mentioned before, the solder (Pb/Sn) of the projection electrode 27 has a mechanical strength (hardness) less than that of gold (Au) forming the wire bump 24. Therefore, by pressing the semiconductor device 22 to the test board 20, the wire bump 24 is inserted into the projection electrode 27.

Figure 8:
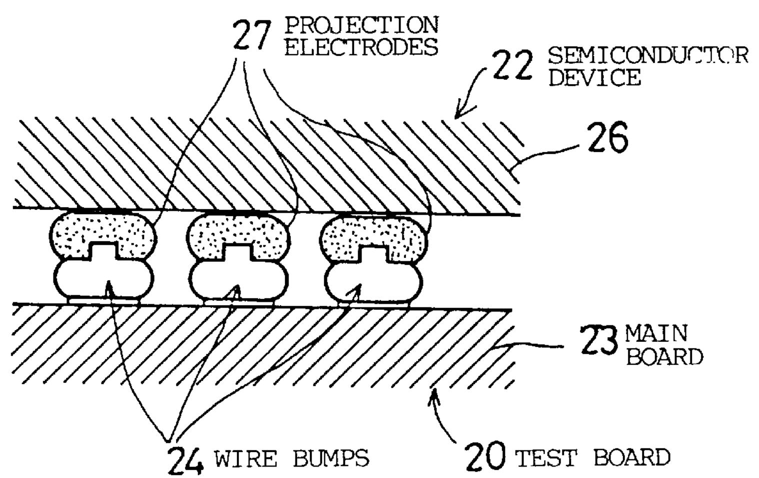
FIG. 8 shows an expanded illustration for explaining a condition in which the wire bumps are inserted into projection electrodes.

In this way, since it is possible to carry out the process of inserting the wire bump 24 into the projection electrode 27 under normal temperature, it is unnecessary to apply heat in the semiconductor-device mounting process. Therefore, the projection electrode 27 are prevented from being degraded by heat. FIG. 8 shows an expanded illustration for explaining the condition in which the wire bumps 24 are inserted into the projection electrodes 27.

In this way, by thrusting the wire bumps 24 into the projection electrodes 27 in the semiconductor-device mounting process, the wire bumps 24 may be electrically connected to the projection electrodes 27. When the wire bumps 24 are inserted into the projection electrodes 27, relatively weak pressure (approximately 2 to 5 grams a bump) is required. However, after the wire bumps 24 are inserted into the projection electrodes 27, it is not necessary to go on pressing the semiconductor device 22 to the test board 20.

Figure 1:
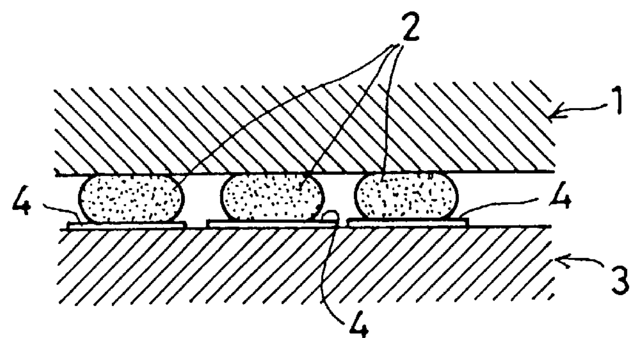
FIG. 1 shows an illustration for explaining a second conventional testing method of a semiconductor device.
Figure 2:
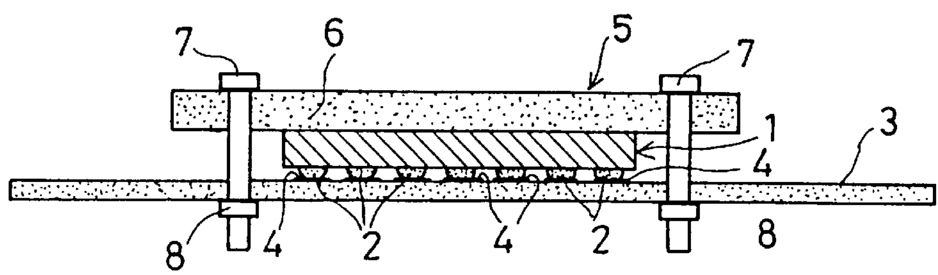
FIG. 2 shows an illustration for explaining a third conventional testing method of a semiconductor device.
Figure 3:
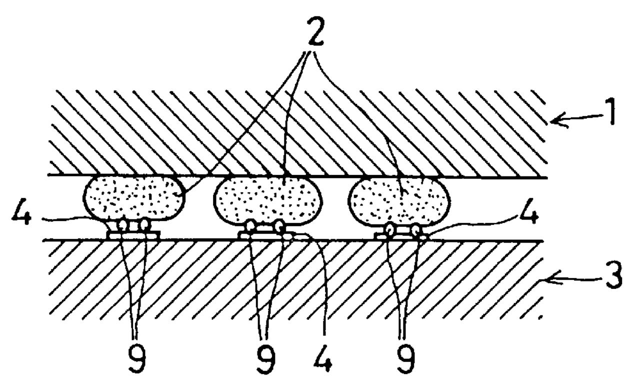
FIG. 3 shows an illustration for explaining a fourth conventional testing method of a semiconductor device.
Figure 4:
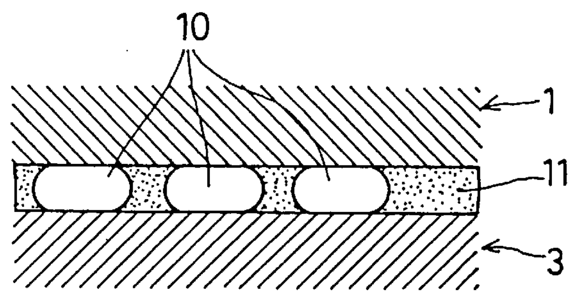
FIG. 4 shows an illustration for explaining a fifth conventional testing method of a semiconductor device.

The above pressure is less than the pressure required for the conventional method. In further detail, for example, in the second conventional method shown in FIG. 2, a pressure of approximately 6 to 20 grams a bump is required. On the contrary, in the first embodiment, the pressure may be reduced to approximately 2 to 5 grams a bump.

Therefore, the wire bumps 24 and the projection electrodes 27 are prevented from being bent or damaged. As compared to the second conventional method shown in FIG. 2, the fixed jig 5 becomes unnecessary, and, thus, the configuration of the test board 20 may be simplified.

Further, in the first embodiment, when the semiconductor device 22 is mounted on the test board 20, a portion of each wire bump 24 goes into the projection electrode 27. Therefore, a strong mechanical connecting strength (specifically, connecting strength in a horizontal direction) between the wire bumps 24 and the projection electrodes 27 is obtained. Accordingly, the semiconductor device 22 is prevented from unexpectedly separating from the test board 20.

In general, it is known that an oxide film is formed on a surface of solder. In the embodiment, when the wire bumps 24 are thrust into the projection electrodes 27, the wire bumps 24 penetrate through the oxide film formed on the surface of the projection electrodes 27, and are connected with the projection electrodes 27. Therefore, it is ensured that the wire bumps 24 are electrically connected with the projection electrodes 27.

Further, when the wire bumps 24 are electrically connected with the projection electrodes 27, it is not necessary to provide other conductive material between the wire bumps 24 and the projection electrodes 27, and between the semiconductor device 22 and the main board 23. Therefore, the other conductive material is prevented from being mixed into the projection electrodes 27. Accordingly, reliability of the projection electrodes 27 may be improved.

After the semiconductor-device mounting process is completed, a testing process starts, and a given test is performed for the semiconductor device 22 by using the wire bumps 24 connected with the projection electrodes 27. In the testing process, as mentioned before, the burn-in test apparatus supplies the given signal to the semiconductor device 22 to be tested through the burn-in test board 21 and the test board 20. The signal generated in the semiconductor device 22 is received in the burn-in test apparatus through the test board 20 and the burn-in test board 21. In this way, the burn-in test apparatus examines whether the semiconductor device 22 is a good article or an article to be rejected.

At this time, the semiconductor device 22 is securely mounted on the test board 20, and the wire bumps 24 are positively electrically connected with the projection electrodes 27. Therefore, the semiconductor device 22 may be tested with a high level of accuracy, namely a highly accurate burn-in test may be performed.

Figure 9:
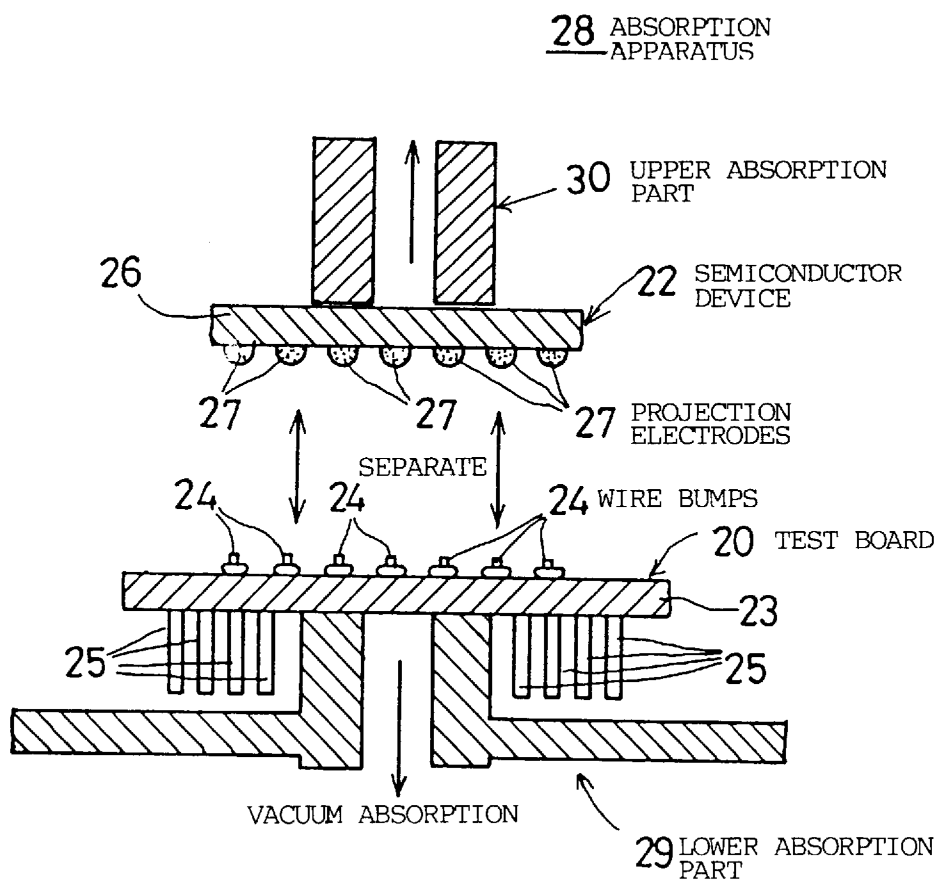
FIG. 9 shows an illustration for explaining a separating process of separating the semiconductor device from the test board.

After the testing process is completed, a separating process starts to separate the semiconductor device 22 from the test board 20. FIG. 9 shows an illustration for explaining the separating process of separating the semiconductor device from the test board.

As shown in FIG. 9, in the separating process, the test board 20 with the semiconductor device 22 is set in an absorption apparatus 28. The absorption apparatus 28 comprising a lower absorption part 29 and an upper absorption part 30, each part being connected to a vacuum pump (not shown). Each of the lower absorption part 29 and the upper absorption part 30 can flexibly move in a vertical direction in FIG. 9.

When the absorption apparatus 28 is set, the lower absorption part 29 is positioned so as to contact a central part of a back face of the test board 20, and the upper absorption part 30 is positioned so as to contact a top face of the semiconductor device 22. After that, force of the vacuum pump is applied to the lower and upper absorption parts 29, 30. The test board 20 is acted on by the lower absorption part 29, and the semiconductor device 22 is acted on by the upper absorption part 30. The lower and upper absorption parts 29, 30 are moved apart from each other. In this way, the semiconductor device 22 is separated from the test board 20.

As mentioned before, the semiconductor device 22 and the test board 20 are connected to each other by the wire bumps 24 inserted into the projection electrodes 27. Therefore, in the above separating process, the semiconductor device 22 is moved apart from the test board 20, and thereby the wire bumps 24 may be easily separated from the projection electrodes 27. The separating process may be carried out under normal temperature conditions, and, thus, the projection electrodes 27 are prevented from being degraded by heat in the separating process.

Further, when the projection electrodes 27 are separated from the wire bumps 24, no portion of the projection electrode 27 remains in the wire bump 24, and no portion of the wire bump 24 remains in the projection electrode 27. Therefore, it is possible to repeatedly use the test board 20, and it becomes unnecessary to adjust the wire bumps 24 for each test. Furthermore, since impurities are prevented from being mixed into the projection electrodes 27, reliability of the projection electrodes 27 may be improved.

After the separating process is completed, a wet-back process starts. In the wet-back process, the form of the projection electrodes 27 is re-shaped. The wet-back process is also performed in the conventional method. In the wet-back process, the projection electrodes 27 are heated and melted to obtain a good shape and a good luster. When the projection electrodes 27 are formed by plating, voids occurring in the projection electrodes 27 by the plating process may be removed in the wet-back process.

By carrying out the wet-back process after the separating process is completed, the process of shaping the projection electrodes 27 may be properly performed. In the following, the wet-back process will be described.

As one of methods of forming the projection electrode 27, a plating method is known. When the projection electrodes 27 are formed by the plating method, a void may be generated within a projection electrode 27 when solder is plated. The projection electrode 27 in which the void is generated has a different shape as compared to a normal projection electrode in which no void is generated. Therefore, to remove the void and to re-shape the projection electrode 27, the wet-back process is carried out. At this time, if the wet-back process is merely carried out without the semiconductor-device mounting process (specifically, the process of inserting the wire bumps 24 into the projection electrodes 27), the void may not be completely removed.

Figure 10A:
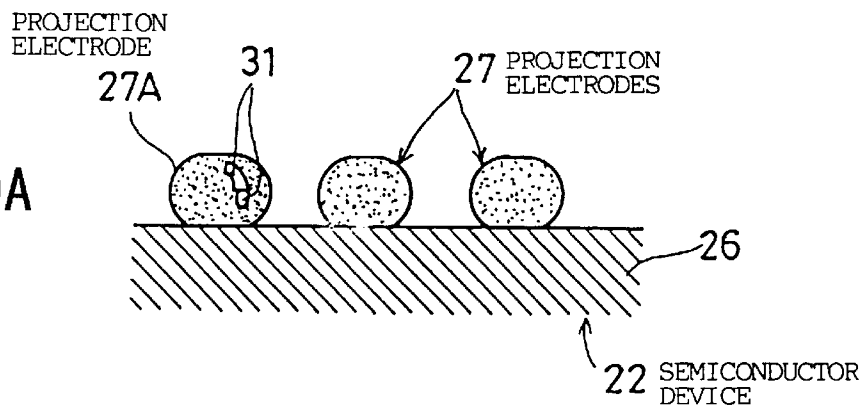
FIG. 10A to FIG. 10C show illustrations for explaining a process of removing a void.
Figure 10B:
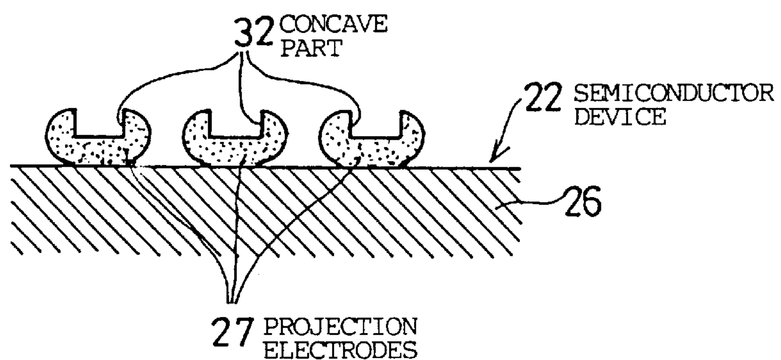
Figure 10C:
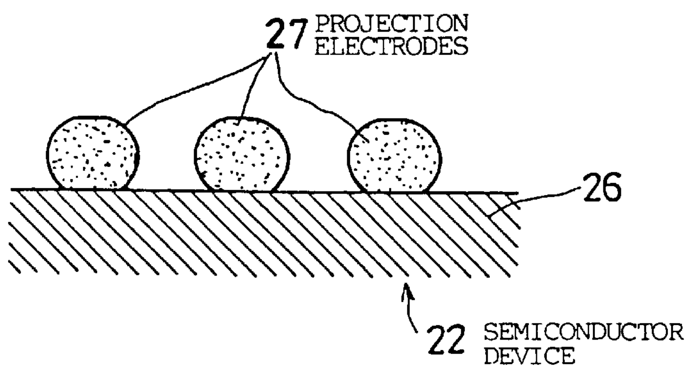

FIG. 10A to FIG. 10C show illustrations for explaining a process of removing the void. FIG. 10A shows the projection electrodes 27 which are shaped in a globular form after the plating process is carried out. In the projection electrode 27A shown to the left in FIG. 10A, void 31 is generated. In this case, if the wet-back process is carried out merely for the projection electrode 27A in which the void 31 is generated, the void 31 may remain.

Therefore, as shown in FIG. 10B, when the wire bumps 24 are inserted into the projection electrodes 27 in the semiconductor-device mounting process, a concave part 32 corresponding to the shape of the wire bump 24 is formed in the projection electrode 27. At this time, the void 31 generated in the projection electrode 27A may be connected with the concave part 32.

After the void 31 is connected with the concave part 32 and is exposed externally, the wet-back process is carried out. Therefore, the void 31 may be completely removed. In this way, by performing the wet-back process after the separating process is completed, the projection electrodes 27, each of which has a good globular form without the void, may be formed, as shown in FIG. 10C.

Figure 11:
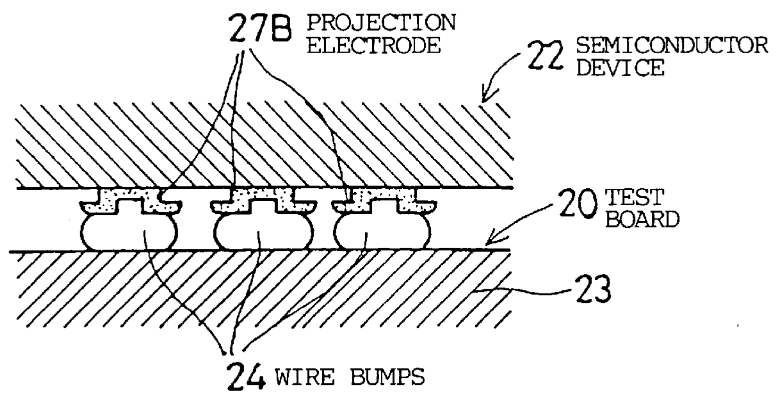
FIG. 11 to FIG. 13 show first, second and third modifications of the first embodiment of the test board of the semiconductor device and the method of testing the semiconductor device according to the present invention.
Figure 12:
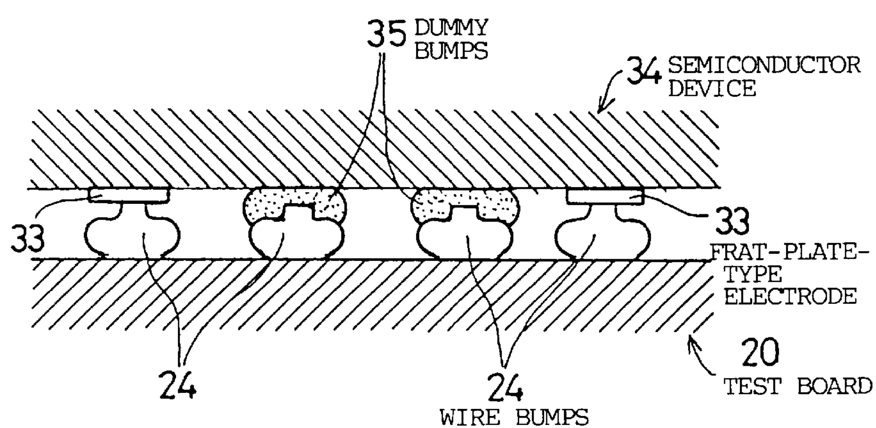
Figure 13:
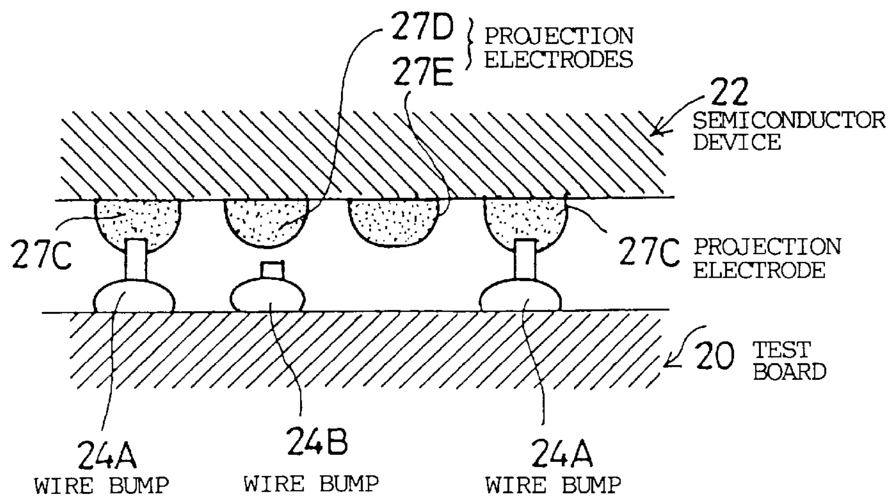

Next, descriptions will be given of modifications of the first embodiment of the test board of the semiconductor device and the method of testing the semiconductor device according to the present invention, by referring to FIG. 11 to FIG. 13. FIG. 11 to FIG. 13 show first, second and third modifications of the first embodiment of the test board of the semiconductor device and the method of testing the semiconductor device according to the present invention.

In a configuration shown in FIG. 11, the wire bumps 24 are directly used for the projection electrodes 27B which are formed by the plating method to test the semiconductor device 22. In general, just after the projection electrodes 27B are formed by the plating method, each projection electrode 27 has a brim-shaped top end part. Therefore, in the above-mentioned first embodiment, the projection electrode 27B having the brim-shaped top end part is shaped to the projection electrode 27 in the globular form in the manufacturing process of the semiconductor device 22. In the shaping process, the projection electrode 27B having the brim-shaped top end part is heated and melted, and is shaped to the globular form by surface tension.

Even if the projection electrode 27B is shaped to the globular form in the manufacturing process of the semiconductor device 22, the concave part 32 is formed in the globularly shaped projection electrode 27 by the wire bump 24 being inserted (refer to FIG. 10B). After that, the wet-back process is carried out and the projection electrode 27 is shaped again.

In the first modification of the first embodiment, the two shaping processes for the projection electrode 27 carried out in the first embodiment are reduced to one shaping process. Whereby, the processes of manufacturing and testing the semiconductor device 22 may be simplified. To meet the above purpose, the first shaping process of the projection electrode 27 which is carried out before testing the semiconductor device 22 is omitted. Thus, the projection electrodes 27B, just after being formed by the plating method, have the wire bumps 24 inserted to test the semiconductor device 22.

According to the configuration of the first modification, the number of heating process for the projection electrodes 27 may be reduced. Therefore, the projection electrodes 27 are prevented from being damaged. Further, the processes of manufacturing and testing the semiconductor device 22 may be simplified.

In the configuration of the second modification of the first embodiment shown in FIG. 12, a semiconductor device 34 having a flat-plate-type electrode 33 (which is referred to as a flat electrode 33) may be tested.

As is well known, as the electrode of the semiconductor device, the flat electrodes 33 are also used as well as projection electrodes 27. The test board 20 and the method according to the present invention are also applicable to the semiconductor device 34 in which the flat electrodes 33 are arranged.

To test the semiconductor device 34 having the flat electrodes 33 by using the test board 20, dummy bumps 35 are previously formed in areas where no flat electrodes 33 are formed on the element body 26, and the wire bumps 24 are arranged so that the positions of the wire bumps 24 correspond to the positions of the flat electrodes 33 and the dummy bumps 35.

Further, the height of each wire bump 24 is adjusted so that the corresponded wire bumps 24 can positively contact with the flat electrodes 33 when the wire bumps 24 are inserted into the dummy bumps 35. As mentioned before, since the wire bumps 24 are formed by using the wire bonding apparatus, the height of each wire bump 24 can be flexibly set.

In the above configuration, when the wire bumps 24 are inserted into the dummy bumps 35, the semiconductor device 34 may be positively mounted on the test board 20. Even if the semiconductor device 34 has the flat electrodes 33 of the flat-plate shape, it is certain the wire bumps 24 and the flat electrode 33 are electrically connected to each other.

In the third modification of the first embodiment shown in FIG. 13, the wire bumps 24 are selectively connected to specified electrodes of a plurality of projection electrodes 27, and the test of the semiconductor device 22 is performed.

In FIG. 13, in general, though a large number of electrodes are formed on the semiconductor device 22, specified electrodes, for example, power supply electrodes, ground electrodes, may not need to be tested. If the wire bumps 24 are inserted into such specified electrodes which do not need to be tested, the specified projection electrodes 27 may be unnecessarily changed in their shape. Thus, the projection electrodes 27 may be degraded.

Therefore, in the third modification, the height of each wire bump 24 is adjusted and the arranged positions of the wire bumps 24 are adjusted. Thus, the wire bumps 24 are not inserted into the specified projection electrodes 27 which do not need to be tested.

In FIG. 13, two wire bumps 24A correspond to two projection electrodes 27C which need to be connected for the test, and a wire bump 24B corresponds to a projection electrode 27D which does not need to be tested. In this case, the height of the wire bump 24A is adjusted to be higher than the height of the wire bump 24B. For a projection electrode 27E which does not need to be tested, no wire bump 24 is arranged at the corresponding position.

As mentioned above, in the embodiment, the height and the arranged position of each wire bump 24 is adjusted according to the necessity of the test of the projection electrodes 27. Therefore, the projection electrodes 27C which need to be tested may be selectively tested, and, thus, the specified projection electrodes 27 which do not need to be tested are prevented from being unnecessarily changed in shape.

Next, a description will be given of the metallic relationship between the wire bumps 24 and the projection electrodes 27 when the wire bumps 24 are inserted into the projection electrodes 27 as shown in FIG. 8.

When the wire bumps 24 are made of gold (Au) and the projection electrodes 27 are made of solder (Pb/Sn), and when the wire bumps 24 are inserted into the projection electrodes 27, there is no possibility that under normal temperature, the wire bumps 24 will react with the projection electrodes 27 so as to produce an alloy or a metallic compound.

However, by an experiment of the inventor, the following has been determined. When the wire bumps 24 are inserted into the projection electrodes 27 and in that condition, the burn-in test is carried out and the heating process at 150° C. (which is referred to as a usage temperature, hereinafter) is carried out, the gold (Au) of the wire bumps 24 may be mixed into the projection electrodes 27, and an alloy of gold and tin (Au/Sn) may be produced within the projection electrodes 27. Also, when the gold content of the projection electrodes 27 is measured after the burn-in process is finished, it is found that the gold content is very small and is less than 100 to 200 ppm.

As is well known, when the alloy of gold and tin (Au/Sn) is produced within the solder (Pb/Sn), the solder becomes fragile and its mechanical strength is degraded. However, when the gold content of the projection electrodes 27 is very small as in the range of less than 100 to 200 ppm, the solder is not be degraded. When the semiconductor device 22 is mounted on the test board 20, positive mounting and reliability may always be obtained.

However, in some equipment and apparatus in which the semiconductor device 22 is used, extremely high reliability is required for the semiconductor device 22. In this case, even if the gold (Au) content of the projection electrodes 27 is very small, such impurities being contained in the projection electrodes 27 may be undesired. To solve the above problem, some methods are proposed. By these methods, the material of the wire bumps 24 will not adversely influence the projection electrodes 27.

In a first method, an additive is added to the base material (Au in the above embodiment) which forms the wire bumps 24 (electrodes to be tested). In this way, the wire bumps 24 are formed such that the wire bumps 24 and the projection electrodes 27 do not produce the alloy or the metallic compound under the usage temperature of the burn-in process.

In this case, for the additive of the base material of gold (Au), silicon (Si), molybdenum (Mo), chrome (Cr), vanadium (V), iron (Fe), nickel (Ni), manganese (Mn), etc., are usable. The base material making the wire bumps 24 is not limited to gold (Au), and for the base material, palladium (Pd), copper (Cu), aluminum (Al), solder (Pb/Sn), low-melting-point solder (Pb/In/Au), the alloy of gold and tin (Au/Sn), etc., are usable.

When a base material other than gold (Au) is used for the wire bumps 24, the additive for the base material may be, silicon (Si), molybdenum (Mo), chrome (Cr), vanadium (V), iron (Fe), nickel (Ni), manganese (Mn), etc.

Each of the above-described materials for the additive has a relatively high temperature melting point. Therefore, when such materials are added to the base material of the wire bumps 24, the melting point of the wire bumps 24 is also increased. In this case, the usage temperature of the burn-in process may not melt the wire bumps 24. Accordingly, the material making the wire bumps 24 is prevented from being mixed into the projection electrodes 27.

In an experiment by the inventor when palladium (Pd) was used for the base material of the wire bumps 24, the palladium (Pd) content of the projection electrodes 27 after the burn-in process is very small, less than 100 to 200 ppm.

As for the base material for the wire bumps 24, each of palladium (Pd), copper (Cu), and aluminum (Al) has a relatively high melting point. Therefore, for the same reason as that mentioned above, the material making the wire bumps 24 is prevented from being mixed into the projection electrodes 27.

The solder (Pb/Sn) and the low-melting-point solder (Pb/In/Au) are the same kind of material as that of the projection electrodes 27. Therefore, even if such material is mixed into the projection electrodes 27, no problems are presented. The alloy of gold and tin (Au/Sn) includes gold (Au) which is undesired to be mixed into the projection electrodes 27. However, since tin is included in the alloy, the amount of gold (Au) which is mixed to the projection electrodes 27 may be reduced.

As mentioned above, in the first method, since the material making the wire bumps 24 is not mixed into the material of the projection electrodes 27 at the usage temperature, it prevents the alloy or the metallic compound is prevented from being produced. Therefore, degradation of the projection electrodes 27 may be prevented.

Figure 14:
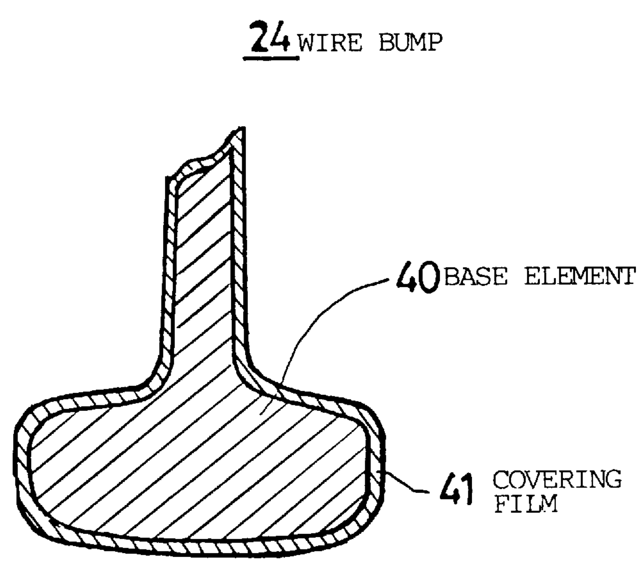
FIG. 14 shows a wire bump being covered by a covering film.

Next, a second method will be described by referring to FIG. 14. FIG. 14 shows a wire bump being covered by a covering film. In the second method, a covering film 41 is formed on the surface of the base element 40 of the wire bump 24. The covering film 41 is made of a material which does not produce an alloy or metallic compound by chemical reaction with the projection electrodes 27 at the usage temperature.

As mentioned above, the material of the covering film 41 needs to be the material which does not produce the alloy or the metallic compound by the projection electrodes 27 of solder (Pb/Sn) at the usage temperature. For such a material, tin (Sn) or nickel (Ni), etc., are usable. The covering film 41 may be easily formed on the surface of the base element 40 by using a conventional apparatus, for example, a sputtering apparatus, used in the semiconductor-device manufacturing process. In this case, even if the alloy is generated between the covering film 41 and the base element 40, no problems are presented.

In this way, by using the second method, since the material of the wire bumps 24 is not mixed into the material of the projection electrodes 27 at the usage temperature, the alloy or the metallic compound is prevented from being produced. Therefore, degradation of the projection electrodes 27 may be prevented.

As described above, the present inventions have the following features.

According to the above-described test board, the testing electrodes are inserted into the projection electrodes. Therefore, the testing electrodes are positively electrically connected to the projection electrodes. Without an external mechanical pressure, the semiconductor device may be securely mounted to the main board. Therefore, the testing electrodes and the projection electrodes are prevented from being changed in shape and damaged. Further, when an oxide film is formed on a surface of the projection electrode, the testing electrode penetrates through the oxide film to be connected to the projection electrode. Therefore, the electrical connection between the testing electrodes and the projection electrodes may be securely provided.

Further, when the testing electrodes are inserted into the projection electrodes, it is not necessary to apply heat. Therefore, at a normal temperature, the electrical connection between the testing electrodes and the projection electrodes may be securely provided. Accordingly, the projection electrodes are prevented from being damaged by heat.

Furthermore, when the testing electrodes and the projection electrodes are electrically connected to each other, it becomes unnecessary to provide other conductive material between the testing electrodes and the projection electrodes, and between the semiconductor device and the main board. Therefore, reliability of the projection electrodes may be improved.

According to the above test board, the additive is added to the base material of the testing electrode. Therefore, the material of the testing electrodes may not produce the alloy or the metallic compound by reacting on the projection electrodes even at a usage temperature in a burn-in process. Accordingly, the projection electrodes are prevented from being damaged.

According to the above test board, the testing electrode is covered by the covering film which is made of a material which does not produce an alloy or metallic compound by reacting with the projection electrodes. By the covering film, the material of the testing electrodes is prevented from being mixed into the projection electrodes. Therefore, degradation of the projection electrodes may be prevented.

Further, the present invention is not limited to these embodiments, but other variations and modifications may be made without departing from the scope of the present invention.

What is claimed is:

1. A test board for testing a semiconductor device provided with projection electrodes, said test board comprising:

a main board; and testing electrodes provided on said main board, each projecting upward from the main board;

wherein said testing electrodes are formed as a cylindrically-shaped wire bump and are electrically connected to said projection electrodes by insertion of said testing electrodes into the projection electrodes and the semiconductor device is mounted on the main board to test the semiconductor device through the testing electrodes, and wherein each of said testing electrodes has a diameter less than a diameter of each of said projection electrodes.

2. The test board as claimed in claim 1, wherein said testing electrodes are formed of a material comprising palladium and an additive, said material of said testing electrodes fails to produce a metallic compound upon reaction with the projection electrodes.

3. The test board as claimed in claim 1, wherein each of said testing electrodes comprises a covering film covering said testing electrodes, and the covering film is a material which fails to produce a metallic compound upon reaction with the projection electrodes.

4. The test board as claimed in claim 3, wherein said material of said covering film comprises nickel (Ni).

5. The test board as claimed in claim 1, wherein said testing electrodes have different heights from a surface of the main board.

6. The test board as claimed in claim 1, wherein said testing electrodes are harder than said projection electrodes.

7. The test board as claimed in claim 1, wherein each of said testing electrodes comprises a pedestal part having a predetermined bottom area, and a projection part extending upwardly from the pedestal part and having a cross-sectional area less than the bottom area of the pedestal part.

8. A method of testing a semiconductor device on which projection electrodes are formed, said method using a test board having a main board and testing electrodes formed on the main board and formed as a cylindrically-shaped wire bump comprising palladium, each of said testing electrodes projecting upwardly from the main board and each of said testing electrodes having a diameter less than a diameter of each of said projection electrodes, said method comprising the steps of:

(a) mounting said semiconductor device on the main board of the test board by inserting said testing electrodes into the projection electrodes, wherein said testing electrodes are electrically connected to the projection electrodes;

(b) testing said semiconductor device by using said testing electrodes connected to the projection electrodes; and (c) separating said semiconductor device from the test board.

9. The method as claimed in claim 8, wherein said method further comprises a wet-back process of shaping the projection electrodes subsequent to said step (c).

10. The method as claimed in claim 8, wherein said projection electrodes comprise at least one wire bump.

* * * * *